(12) United States Patent
Buot et al.

(10) Patent No.: US 8,093,717 B2
(45) Date of Patent: Jan. 10, 2012

(54) MICROSTRIP SPACER FOR STACKED CHIP SCALE PACKAGES, METHODS OF MAKING SAME, METHODS OF OPERATING SAME, AND SYSTEMS CONTAINING SAME

(75) Inventors: Joan Rey V. Buot, Cebu (PH); Christian Orias, Metro Manila (PH)

(73) Assignee: Intel Corporation, Santa Clara, CA (US)

( * ) Notice: Subject to any disclaimer, the term of this patent is extended or adjusted under 35 U.S.C. 154(b) by 456 days.

(21) Appl. No.: 11/298,377

(22) Filed: Dec. 9, 2005

(65) Prior Publication Data

US 2007/0132070 A1 Jun. 14, 2007

(51) Int. Cl.
*H01L 23/34* (2006.01)

(52) U.S. Cl. ........ 257/723; 257/724; 257/777; 257/306; 257/532; 428/261; 428/238; 428/109; 428/110; 428/107

(58) Field of Classification Search .................. 257/723, 257/724, 777, 306, 532; 438/261, 238, 109, 438/110, 107
See application file for complete search history.

(56) References Cited

U.S. PATENT DOCUMENTS

| | | | | |
|---|---|---|---|---|
| 5,864,177 A | * | 1/1999 | Sundstrom | ..................... 257/723 |
| 6,943,294 B2 | * | 9/2005 | Kang et al. | ..................... 174/541 |
| 2002/0024146 A1 | | 2/2002 | Furusawa | |
| 2004/0051119 A1 | * | 3/2004 | Kikuma et al. | ............... 257/200 |
| 2005/0133916 A1 | * | 6/2005 | Karnezos | ..................... 257/738 |
| 2005/0135041 A1 | | 6/2005 | Kang et al. | |
| 2005/0170600 A1 | * | 8/2005 | Fukuzo | ......................... 438/396 |
| 2005/0194694 A1 | | 9/2005 | Takahashi | |
| 2005/0202592 A1 | * | 9/2005 | Haba | ............................. 438/107 |
| 2005/0208701 A1 | * | 9/2005 | Jeong et al. | ................... 438/106 |

FOREIGN PATENT DOCUMENTS

| | | |
|---|---|---|
| KR | 10-2004-0072645 | 8/2004 |
| WO | WO-2007070304 A1 | 6/2007 |

OTHER PUBLICATIONS

Foreign Office Action mailed Feb. 27, 2009 in the related Chinese Application No. 200680041743.7, 16 pgs.
International Search Report and The Written Opinion received for PCT Application No. PCT/US2006/046527, mailed on May 14, 2007, 11 pages.
Written Opinion Received for Singapore Patent Application No. 200803224-5, mailed on Jul. 14, 2009, 7 pages.
Office Action received for Taiwan patent Application No. 95145699, mailed on Mar. 30, 2010, 21 pages including English translation.

(Continued)

*Primary Examiner* — Zandra Smith
*Assistant Examiner* — Telly Green
(74) *Attorney, Agent, or Firm* — John N. Greaves

(57) ABSTRACT

A chip package includes a microstrip spacer disposed between a first die and a second die. The microstrip spacer includes electrically conductive planes that are ground planes for at least one of the first die and the second die. A method includes operating the first die at a first clock speed and operating the second die at a second clock speed. A system includes a chip package with a microstrip spacer and a system housing.

10 Claims, 8 Drawing Sheets

OTHER PUBLICATIONS

Office Action received for Korean Patent Application No. 10-2008-7013791, mailed on May 27, 2010, 6 pages of English translation.

Written Opinion Received for Singapore Patent Application No. 200803224-5, mailed on Apr. 26, 2010, 7 pages.

Office Action received for Chinese patent Application No. 200680041743.7, mailed on Feb. 27, 2009, 16 pages of Chinese Office Action including 8 pages of English translation.

Office Action received for Taiwanese patent Application No. 95145699, mailed on Mar. 30, 2010, 20 pages of Taiwanese Office Action including 11 pages of English translation.

Office Action received for Taiwanese patent Application No. 95145699, mailed on Jan. 31, 2011, 20 pages of Taiwanese Office Action including 10 pages of English translation.

* cited by examiner

MICROSTRIP SPACER FOR STACKED CHIP SCALE PACKAGES, METHODS OF MAKING SAME, METHODS OF OPERATING SAME, AND SYSTEMS CONTAINING SAME

TECHNICAL FIELD

Embodiments relate generally to a chip-level integration of devices.

TECHNICAL BACKGROUND

Stacked chip-scale packaging (SCSP) is accomplished in small packages in order to allow for smaller and higher speed devices. As package sizes get smaller signal integrity must be maintained despite the closer distances between signal and power traces. Device transients also require high-speed capacitors to respond to the increasing faster processing in the device packages. These capacitors must often be located relatively remotely from the integrated circuit (IC) chips.

BRIEF DESCRIPTION OF THE DRAWINGS

In order to depict the manner in which the embodiments are obtained, a more particular description of embodiments briefly described above will be rendered by reference to exemplary embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Embodiments in this disclosure relate to an apparatus that includes a microstrip spacer (MSS) that is disposed between two IC dice. Embodiments also relate to methods of assembling such microstrip spacers with the IC dice. Embodiments also relate to methods of operating a device that includes an MSS and IC die embodiment. Embodiments also relate to computing systems that incorporate an MSS and dice package.

The following description includes terms, such as upper, lower, first, second, etc. that are used for descriptive purposes only and are not to be construed as limiting. The embodiments of an apparatus or article described herein can be manufactured, used, or shipped in a number of positions and orientations. The term "microstrip" generally refers to a dielectric body with a plurality of electrically conductive planes disposed in isolation within the dielectric body. The thickness of a microstrip can be in a range from about 1,000 microns (μm) and smaller. In an embodiment, the thickness of the microstrip is in a range from about 20 μm to about 120 μm. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show the structures necessary to understand the illustrated embodiments. Additional structures known in the art have not been included to maintain the clarity of the drawings.

Figure 1:
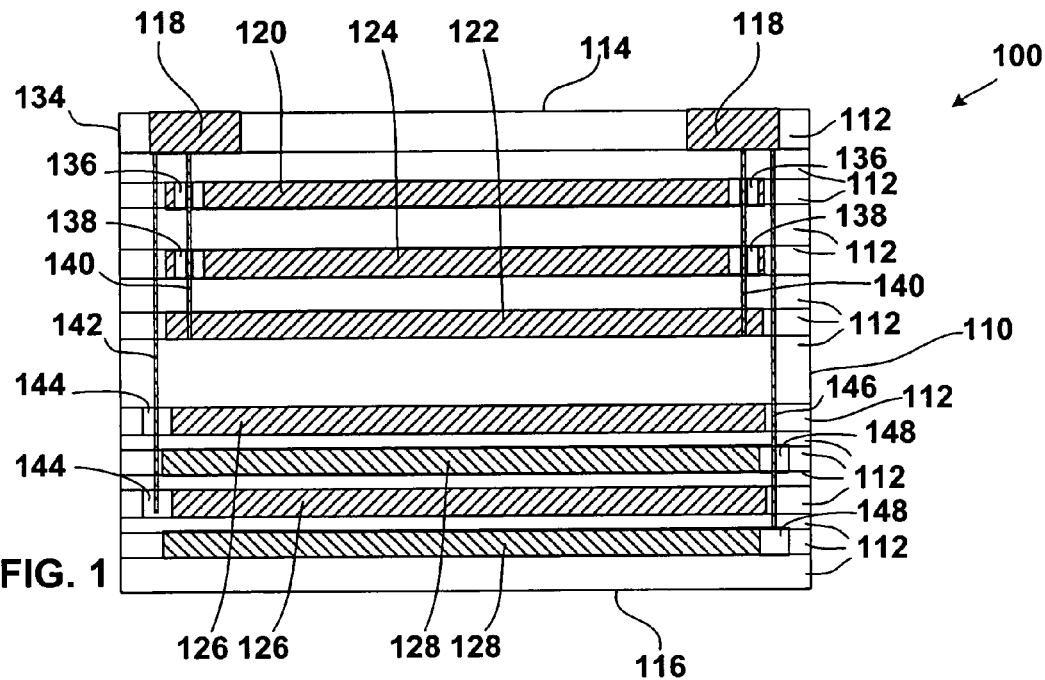
FIG. 1 is a cross-section elevation of the MSS depicted in FIG. 2 along the section line 1-1 according to an embodiment.
Figure 2:
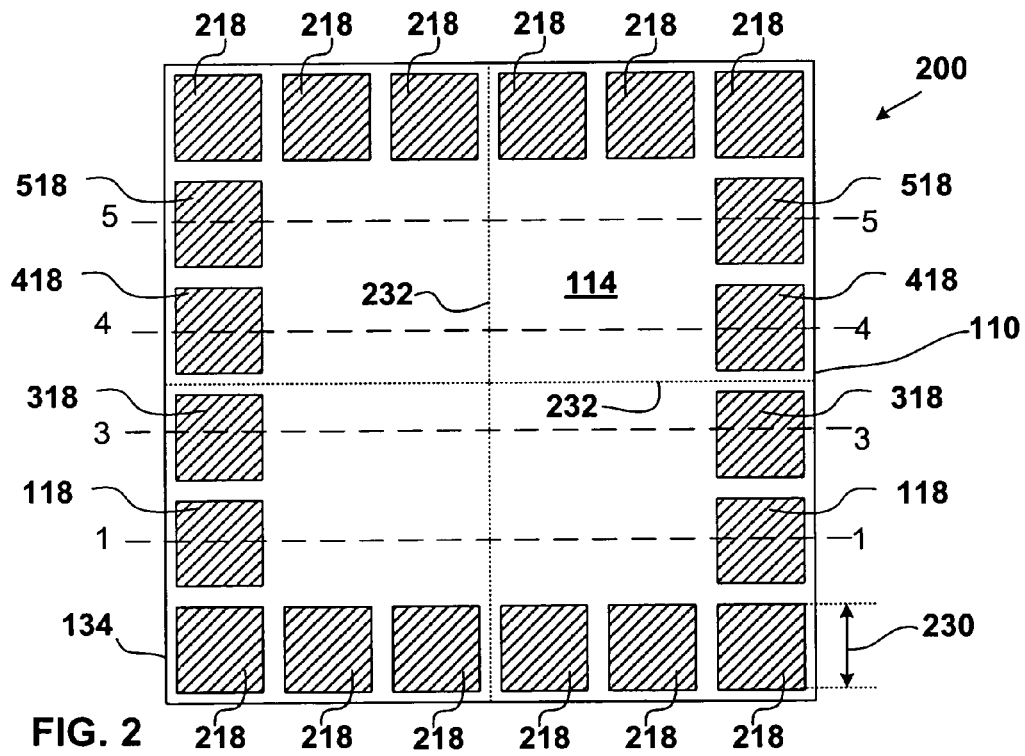
FIG. 2 is a top plan of a microstrip spacer (MSS) according to an embodiment.

FIG. 1 is a cross-section elevation 100 of the MSS depicted in FIG. 2 along the section line 1-1 according to an embodiment. The MSS 110 is depicted in at least exaggerated vertical detail for clarity. The MSS 110 includes a dielectric body 112. The MSS 110 includes a first side 114 and a second side 116. The MSS 110 includes a plurality of bond pads, two of which are depicted in FIG. 1 with reference numeral 118. The several planar structures of the dielectric body 112 can be manufactured by a laminating process that also produces several conductive planes. Hereinafter, the dielectric body 112, although it includes several dielectric planes 112, will be represented with a single reference numeral. In an embodiment, the MSS 110 includes a plurality of spaced-apart conductive planes. In FIG. 1, a first conductive plane 120 is depicted along with a subsequent conductive plane 122 as well as an intermediate conductive plane 124. Although the number of conductive planes in FIG. 1 is depicted as three, there may be more or less than three according to various embodiments as a specific application may require.

In an embodiment, any of the conductive planes is patterned into an inductor such as a spiral inductor. The patterning thereof is conventional. In an embodiment, any of the conductive planes is patterned into a resistor. The patterning thereof is conventional. In an embodiment, any of the conductive planes is patterned into a fuse. The patterning thereof is conventional.

In an embodiment, the MSS 110 includes a capacitor structure that includes a first electrode 126 and a second electrode 128. In an embodiment, the MSS 110 includes the plurality of spaced-apart conductive planes (at least first conductive plane 120 and subsequent conductive plane 122) and the MSS 110 does not include a capacitor structure. In an embodiment, the MSS 110 includes a capacitor structure such as the first electrode 126 and the second electrode 128 and the MSS 110 does not include the plurality of spaced-apart conductive planes.

In an embodiment, the capacitor structure is a two-electrode thin-film capacitor. In this embodiment, only one occurrence each of the first electrode 126 and the second electrode 128 are present in the MSS 110. In an embodiment, the capacitor structure is an interdigital capacitor such as plural occurrences of the first electrode 126 and the second electrode 128 as depicted in FIG. 1.

FIG. 2 is a top plan 200 of the MSS 110 according to an embodiment. The MSS 110 in FIG. 1 is derived along the section line 1-1 in FIG. 2. The first side 114 is exposed along with a plurality of MSS bond pads, which are variously designated as bond pads 118, 218, 318, 418, and 518 for illustrative purposes throughout FIGS. 1-5. The various bond pads (hereinafter with respect to FIG. 2 "bond pads 218") are substantially the same in dimension and composition. In an embodiment, the MSS bond pads 218 have a width 230 in a range from about 30 micrometers (μm) to about 300 μm or larger. In an embodiment, the MSS bond pads 218 have a width 230 in a range from about 53 μm to about 106 μm. The MSS 110 is depicted as sectioned into four sections along section lines 232. In an embodiment, the MSS 110 as a section unit contains MSS bond pads 118 only along the external edges 134 of the dielectric body 112. In an embodiment, the MSS includes more MSS bond pads than just along an external edge as set forth herein.

Referring again to FIG. 1, the MSS 110 is structured to electrically access the subsequent conductive plane 122 through the MSS bond pad 118. Accordingly, the first conductive plane 120 is insulated by first microspacers 136. Similarly, the intermediate conductive plane 124 is insulated by intermediate microspacers 138. Electrical coupling between the MSS bond pad 118 and the subsequent conductive plane 122 is accomplished by a conductive plane contact 140. As viewed in FIG. 1, the capacitor structure is also insulated from capacitor contacts. A first electrode contact 142 is insulated from the first electrode 126 by first electrode microspacers 144. A second electrode contact 146 is insulated from the second electrode 128 by second electrode microspacers 148.

In an embodiment, fabrication of the MSS 110 is carried out by a series of lamination processes. Such processing can be ascertained by observing the several planar structures in the MSS 110, and appreciating that patterning and deposition process can accomplish the MSS 110. For example starting at the second side 116 of the MSS 110, the dielectric body 112 that forms the second side 116 is a first layer in a lamination and patterning process. Continuing upward in FIG. 1, the first side 114 of the MSS 110 is formed by the dielectric body 112 that forms the first side 114, and as illustrated, the MSS bond pads 118 are last filled into the MSS. In an embodiment, the MSS bond pads 118 sit upon the first side 114 instead of being substantially flush therewith as illustrated.

Figure 3:
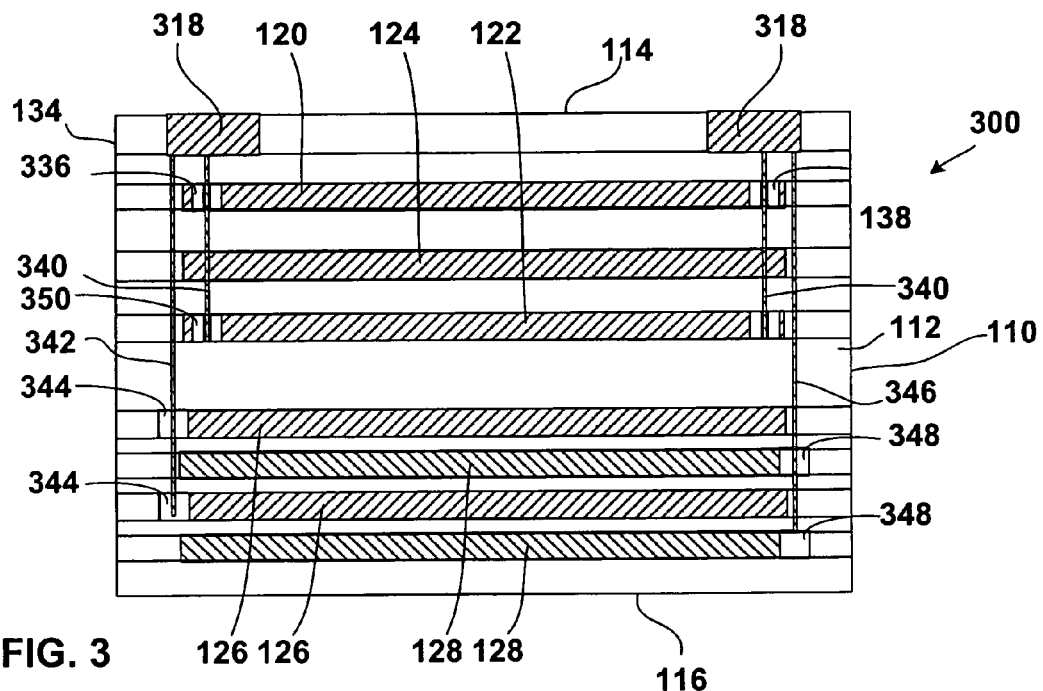
FIG. 3 is a cross-section elevation of the MSS depicted in FIG. 1 along the section line 3-3 according to an embodiment.

FIG. 3 is a cross-section elevation 300 of the MSS depicted in FIG. 2 along the section line 3-3 according to an embodiment. The MSS 110 includes the dielectric body 112. The MSS 110 includes the first side 114 and the second side 116. The MSS 110 includes the plurality of bond pads, two of which are depicted in FIG. 3 with reference numeral 318.

In an embodiment, the MSS 110 includes the plurality of spaced-apart conductive planes. In FIG. 3, the first conductive plane 120 is depicted along with the subsequent conductive plane 122 as well as the intermediate conductive plane 124.

The MSS 110 is structured to electrically access the intermediate conductive plane 124 through the MSS bond pads 318. Accordingly, the first conductive plane 120 is insulated by first microspacers 336. Similarly, the subsequent conductive plane 124 is insulated by subsequent microspacers 350. Electrical coupling between the MSS bond pad 318 and the intermediate conductive plane 124 is accomplished by a conductive plane contact 340. As viewed in FIG. 3, the capacitor structure is also insulated from capacitor contacts. A first electrode contact 342 is insulated from the first electrode 126 by first electrode microspacers 344. A second electrode contact 346 is insulated from the second electrode 128 by second electrode microspacers 348. Accordingly, although contacts penetrate the MSS 110, the microspacers are configured to insulate specific contacts and to connect other specific contacts.

Figure 4:
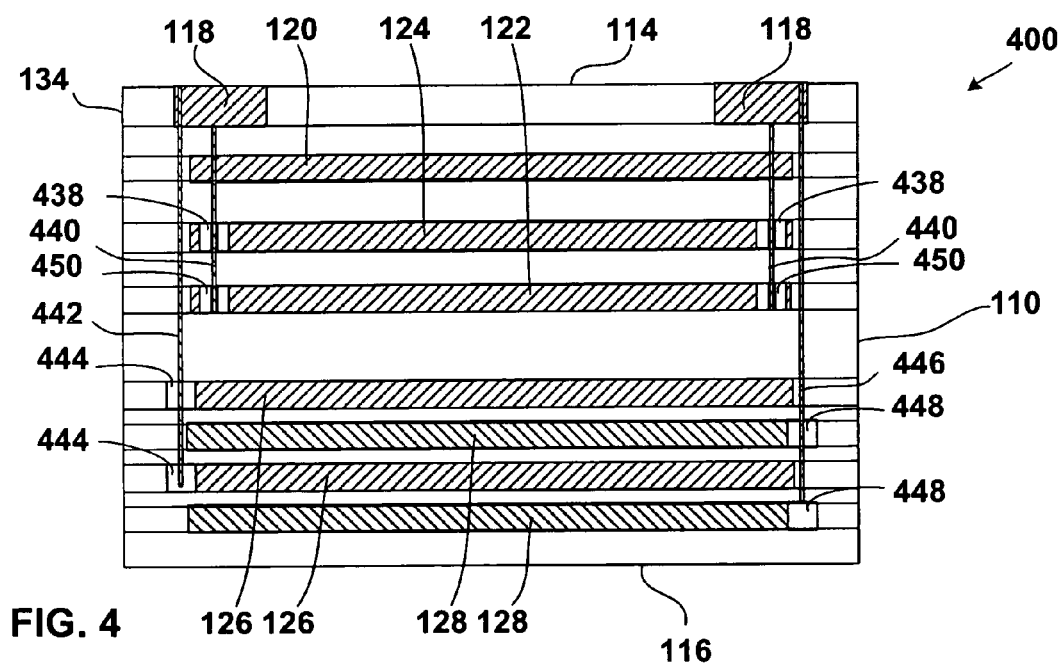
FIG. 4 is a cross-section elevation of the MSS depicted in FIG. 1 along the section line 4-4 according to an embodiment.

FIG. 4 is a cross-section elevation 400 of the MSS depicted in FIG. 2 along the section line 4-4 according to an embodiment. The MSS 110 includes the dielectric body 112. The MSS 110 includes the first side 114 and the second side 116. The MSS 110 includes the plurality of bond pads, two of which are depicted in FIG. 4 with reference numeral 418.

In an embodiment, the MSS 110 includes the plurality of spaced-apart conductive planes. In FIG. 4, the first conductive plane 120 is depicted along with the subsequent conductive plane 122 as well as the intermediate conductive plane 124.

The MSS 110 is structured to access the first conductive plane 120 through the MSS bond pads 418. Accordingly, the subsequent conductive plane 122 is insulated by subsequent microspacers 450. Similarly, the intermediate conductive plane 124 is insulated by intermediate microspacers 438. Electrical coupling between the MSS bond pads 418 and the first conductive plane 122 is accomplished by a conductive plane contact 440. As viewed in FIG. 4, the capacitor structure is also insulated from capacitor contacts. A first electrode contact 442 is insulated from the first electrode 126 by first electrode microspacers 444. A second electrode contact 446 is insulated from the second electrode 128 by second electrode microspacers 448. Accordingly, although contacts penetrate the MSS 110, the microspacers are configured to insulate specific contacts and to connect other specific contacts.

Figure 5:
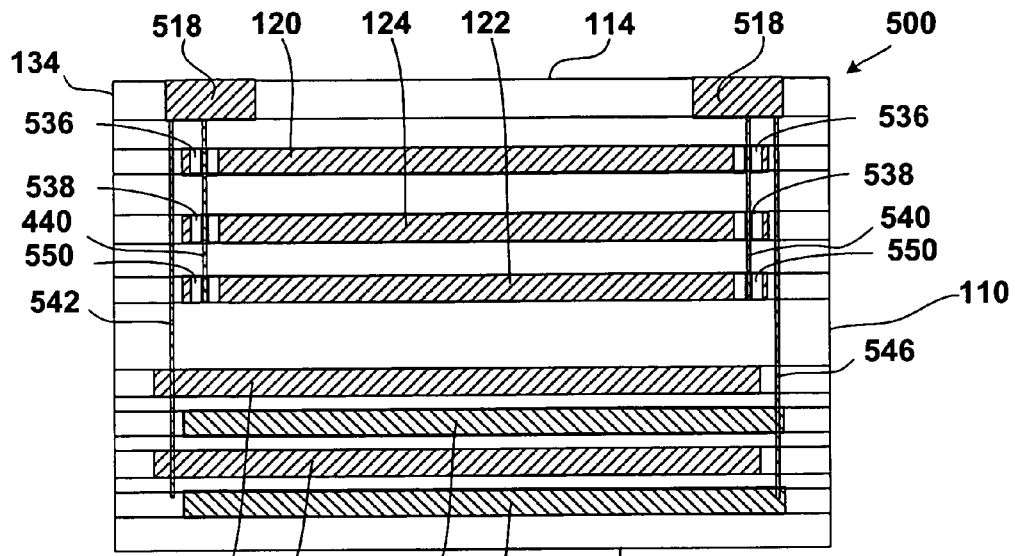
FIG. 5 is a cross-section elevation of the MSS depicted in FIG. 1 along the section line 5-5 according to an embodiment.

FIG. 5 is a cross-section elevation 500 of the MSS depicted in FIG. 1 along the section line 5-5 according to an embodiment. The MSS 110 includes the dielectric body 112. The MSS 110 includes the first side 114 and the second side 116. The MSS 110 includes the plurality of bond pads, two of which are depicted in FIG. 5 with reference numeral 518.

In an embodiment, the MSS 110 includes the plurality of spaced-apart conductive planes. In FIG. 5, the first conductive plane 120 is depicted along with the subsequent conductive plane 122 as well as the intermediate conductive plane 124.

The MSS 110 is structured to access the capacitor structure. A first electrode contact 542 couples one of the MSS bond pads 518 with the first electrode 126. A second electrode contact 546 couples the other of the MSS bond pads 518 with the second electrode 128.

The MSS 110 is structured to insulate the spaced-apart conductive planes 120, 122, and 124 from the capacitor structure. Accordingly, the first conductive plane 120 is insulated by first microspacers 536. Similarly, the subsequent conductive plane 122 is insulated by subsequent microspacers 550. And similarly, the intermediate conductive plane 124 is insulated by intermediate microspacers 538. Accordingly, although contacts penetrate the MSS 110, the microspacers are configured to insulate specific contacts and to connect other specific contacts.

Figure 6:
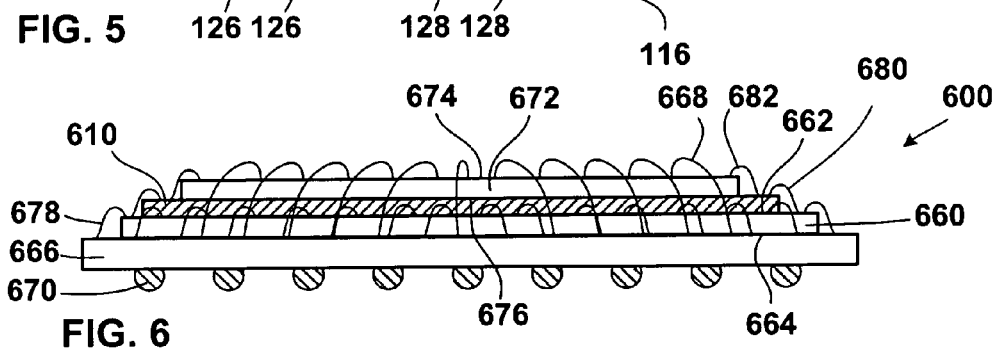
FIG. 6 is a cross-section elevation of a chip package that includes an MSS between two microelectronic dice according to an embodiment.

FIG. 6 is a cross-section elevation of a chip package 600 that includes an MSS between two microelectronic dice according to an embodiment. The chip package 600 includes an MSS 610. The chip package 600 also includes a first die 660 with an active surface 662 and a backside surface 664. In an embodiment, the first die 660 includes a backside metallization (BSM), which is conventional. The MSS 610 is disposed on the first die 660 active surface 662. In an embodiment, the first die 660 is wire-bonded to a mounting substrate 666. The wire bonding is accomplished with at least one bond wire, one of which is designated with the reference numeral 668. In an embodiment, the mounting substrate 666 communicates electrically to the external world with a plurality of electrical bumps, one of which is designated with the reference numeral 670.

In an embodiment, a second die 672 is disposed on the MSS 610. In this embodiment, the second die 672 includes an active surface 674 and a backside surface 676. The MSS 610 is disposed on the second die 672 backside surface 676. In an embodiment, the second die 672 is wire-bonded to the mounting substrate 666. The wire bonding is accomplished with at least one bond wire, one of which is designated with the reference numeral 678.

In this embodiment, the MSS 610 is electrically coupled to the first die 660 by way of first die bond wire 680. Accordingly, the MSS 610 can give or receive either or both of power and signal communication from the first die 660. Similarly, a decoupling capacitor such as any illustrated capacitor structure depicted in FIGS. 1, 3, 4, 5, 7 and equivalents, can communicate to the first die 660. Also in this embodiment, the MSS 610 is electrically coupled to the second die 672 with at least one second die bond wire, one of which is designated with the reference numeral 682. Accordingly, the MSS 610 can give or receive either or both of power and signal communication from the second die 672. Similarly, a decoupling capacitor such as any illustrated capacitor structure depicted in FIGS. 1, 3, 4, 5, 7 and equivalents, can communicate to the second die 672.

In an embodiment, the first die 660 is a logic chip such as a processor, and the second die 672 is a memory chip such as flash memory. In an embodiment, the first die 660 is a memory chip, and the second die 672 is a processor. In an embodiment, the first die 660 is logic chip and the second die 672 is a DSP chip. It now becomes apparent that the first die 660 and the second die 672 can be any combination of processor, memory, and DSP chips. One of these combinations includes two processors. One of these combinations includes a processor and a memory chip. One of these combinations includes two memory chips. One of these combinations includes a DSP chip in lieu of either of the memory chip or the processor. One of these combinations includes an embedded DSP chip in either a processor or a memory chip.

In a method embodiment, the first die 660 is a processor chip from Intel Corporation of Santa Clara, Calif. that operates at a first clock speed, and the second die 672 is a flash memory chip that operates at a second clock speed. In a first example, the first die 660 is a processor chip that is wire-bonded by the first die bond wire 680 to a conductive plane, e.g., through the MSS bond pad 418 to the first conductive plane 120 as a ground plane for a clock circuit. The first die runs at the first clock speed. In this example, the second die 672 operates at a voltage that is typical for NOR ("not or", in Boolean logic) flash memory, and the second die is wire-bonded by the second die bond wire 682 to a conductive plane, e.g., through the MSS bond pad 318 to the intermediate conductive plane 124 as a ground for the flash memory voltage circuit. Further to this example, the first die 660 calls for voltage suppliants for load transients of the processor chip 660, from the capacitor structure that is wire-bonded by a first die wire bond to the MSS bond pad 518 and through the first electrode contact 542 to the first electrode 126. In an embodiment, the first die 660 operates at the first clock speed, which is larger than the second clock speed for the second die 672.

Figure 7:
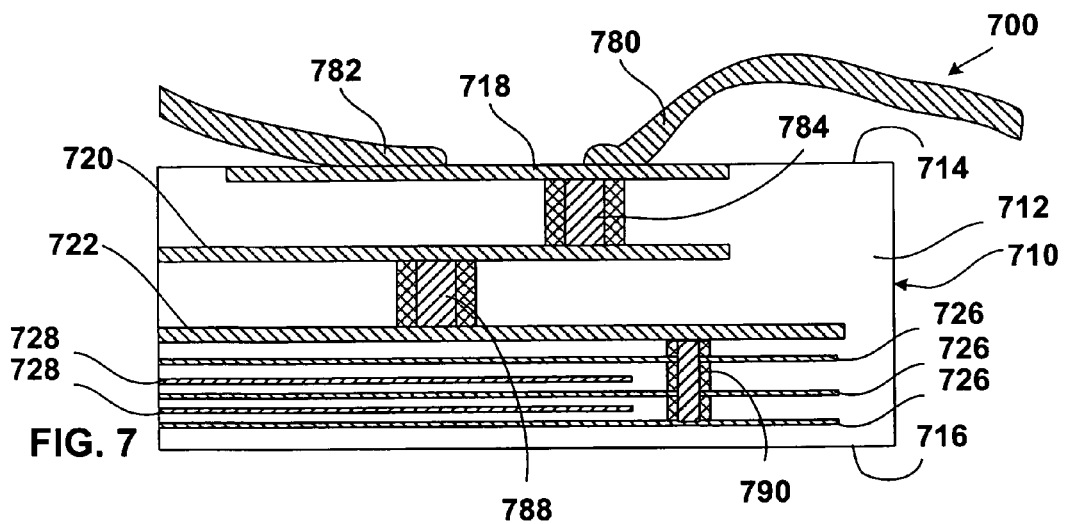
FIG. 7 is a detail of the MSS in the chip package depicted in FIG. 6 according to an embodiment.

FIG. 7 is a detail 700 of an MSS 710 according to an embodiment. The MSS 710 includes a dielectric body 712. The MSS 710 includes a first side 714 and a second side 716. The MSS 710 includes a plurality of bond pads, one of which is depicted in FIG. 7 with reference numeral 718. In an embodiment, the MSS 710 includes a plurality of spaced-apart conductive planes. In FIG. 7, a first conductive plane 720 is depicted along with a subsequent conductive plane 722. Although the number of conductive planes in FIG. 7 is depicted as two, there may be more or less than two according to various embodiments as a specific application may require.

In an embodiment, the MSS 710 includes a capacitor structure that includes a first electrode 726 and a second electrode 728. In this embodiment, the capacitor structure is an interdigital capacitor such as plural occurrences of the first electrode 726 and the second electrode 728 as depicted in FIG. 7.

In this embodiment, the MSS 710 is electrically coupled to a first die, such as first die 660 depicted in FIG. 6, by way of the first die bond wire 780. Accordingly, the MSS 710 can give or receive either or both of power and signal communication from a first die. Similarly, the capacitor structure depicted FIG. 7, and equivalents, can communicate to a first die, such as first die 660 depicted in FIG. 6. Also in this embodiment, the MSS 710 is electrically coupled to a second die, such as second die 672 depicted in FIG. 6, by the second die bond wire 782. Accordingly, the MSS 610 can give or receive either or both of power and signal communication from the second die 672. Similarly, the capacitor structure depicted in FIG. 7, and equivalents, can communicate to the second die 672.

In an embodiment, routed microvias 784, 788, and 790 couple the capacitor structure to the MSS bond pad 718. The routed microvias 784, 788, and 790 are depicted as contrasting embodiments to the contact-containing microvias depicted in FIGS. 1, 3, 4, and 5.

Figure 8:
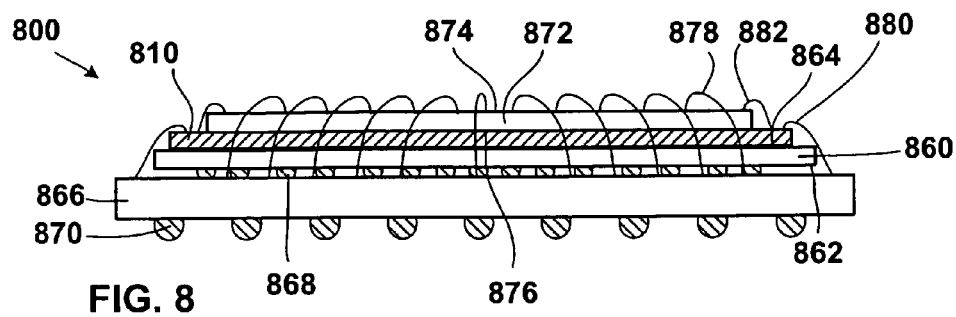
FIG. 8 is a cross-section elevation of an MSS between two microelectronic dice according to an embodiment.

FIG. 8 is a cross-section elevation of a package 800 that includes an MSS 810 between two microelectronic dice 860 and 872 according to an embodiment. The package 800 includes a first die 860 with an active surface 862 and a backside surface 864. The MSS 810 is disposed on the first die 860 backside surface 864 and the first die 860 is flip-chip disposed on a mounting substrate 866. The flip-chip bonding is accomplished with at least one electrical bump, one of which is designated with the reference numeral 868. In an embodiment, the mounting substrate 866 communicates electrically to the external world with a plurality of first die electrical bumps, one of which is designated with the reference numeral 870.

In an embodiment, the second die 872 includes an active surface 874 and a backside surface 876. The MSS 810 is disposed on the second die 872 backside surface 876. In an embodiment, the second die 872 is wire-bonded to the mounting substrate 866. The wire bonding is accomplished with at least one bond wire, one of which is designated with the reference numeral 878.

In this embodiment, the MSS 810 is electrically coupled to the first die 860 by way of the first die electrical bumps 870 and through the mounting substrate 866 and an MSS-to-mounting substrate bond wire 880. Accordingly, the MSS 810 can give or receive either or both of power and signal communication from the first die 860. Similarly, a decoupling capacitor such as any illustrated capacitor structure depicted in FIGS. 1, 3, 4, 5, 7 and equivalents, can communicate to the first die 860. Also in this embodiment, the MSS 810 is electrically coupled to the second die 872 by a second die bond wire 882. Accordingly, the MSS 810 can give or receive either or both of power and signal communication from the second die 872. Similarly, a decoupling capacitor such as any illustrated capacitor structure depicted in FIGS. 1, 3, 4, 5, 7 and equivalents, can communicate to the second die 872.

In an embodiment, the first die 860 is a logic chip such as a processor, and the second die 872 is a memory chip such as flash memory. In an embodiment, the first die 860 is a memory chip, and the second die 872 is a processor. In an embodiment, the first die 860 is logic chip and the second die 872 is a DSP chip. It now becomes apparent that the first die 860 and the second die 872 can be any combination of processor, memory, and DSP chips. One of these combinations includes two processors. One of these combinations includes a processor and a memory chip. One of these combinations includes two memory chips. One of these combinations includes a DSP chip in lieu of either of the memory chip or the processor. One of these combinations includes an embedded DSP chip in either a processor or a memory chip.

In a method embodiment, the first die 860 is a processor chip from Intel Corporation of Santa Clara, Calif. that operates at a first clock speed, and the second die 872 is a flash memory chip that operates at a second clock speed. In a first example, the first die 860 is a processor chip that is flip-chip bonded by the first die electrical bump 868 to a conductive plane, e.g., through the MSS bond pad 418 to the first conductive plane 120 as a ground plane for a clock circuit. The first die 860 runs at the first clock speed. In this example, the second die 872 operates at a voltage that is typical for NOR ("not or", in Boolean logic) flash memory, and the second die is wire-bonded by the second die bond wire 882 to a conductive plane, e.g., through the MSS bond pad 318 to the intermediate conductive plane 124 as a ground for the flash memory voltage circuit. Further to this example, the first die 860 calls for voltage suppliants for load transients of the processor chip 860, from the capacitor structure that is wire-bonded by a first die wire bond to the MSS bond pad 518 and through the first electrode contact 542 to the first electrode 126. In an embodiment, the first die 860 operates at the first clock speed, which is larger than the second clock speed for the second die 872.

Figure 9:
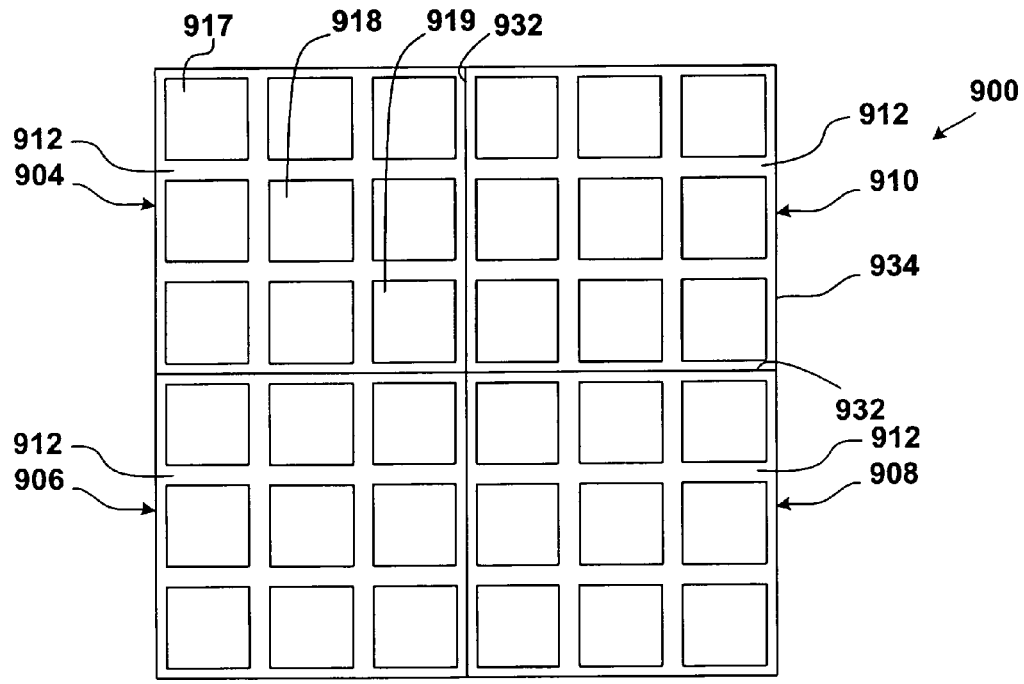
FIG. 9 is a top plan of a modular MSS according to an embodiment.

FIG. 9 is a top plan 900 of a modular MSS 910 according to an embodiment. The modular MSS 900 includes a dielectric body 912. In an embodiment, the modular MSS 900 includes four MSS modules 910, 908, 906, and 904. The MSS 910 is depicted as sectioned into four sections along section lines 932. Each MSS module 910, 908, 906, and 904 includes a plurality of MSS bond pads, three of which are depicted, when assembled as illustrated, as respective edge 917, intermediate 918, and inner 919 MSS bond pads. In this embodiment, each MSS module 910, 908, 906, and 904 is configured with a three-by-three array of MSS bond pads. According to an embodiment, the modular MSS 910 is assembled from four three-by-three bond-pad configured MSS modules 910, 908, 906, and 904. In an embodiment, the number of MSS bond pads, the configuration of MSS bond pads follows a given chip shape or given chip shapes in a stacked chip-scale package. In an embodiment, whether there are full MSS bond pads, e.g., in a filled-in n-by-m matrix (where n and m are separately greater than or equal to two), or whether the MSS bond pads only border proximate the external edges 934 of the dielectric body 912 such as is depicted in FIG. 2, the configuration of microstrip spacer structures can follow a given application.

Figure 10:
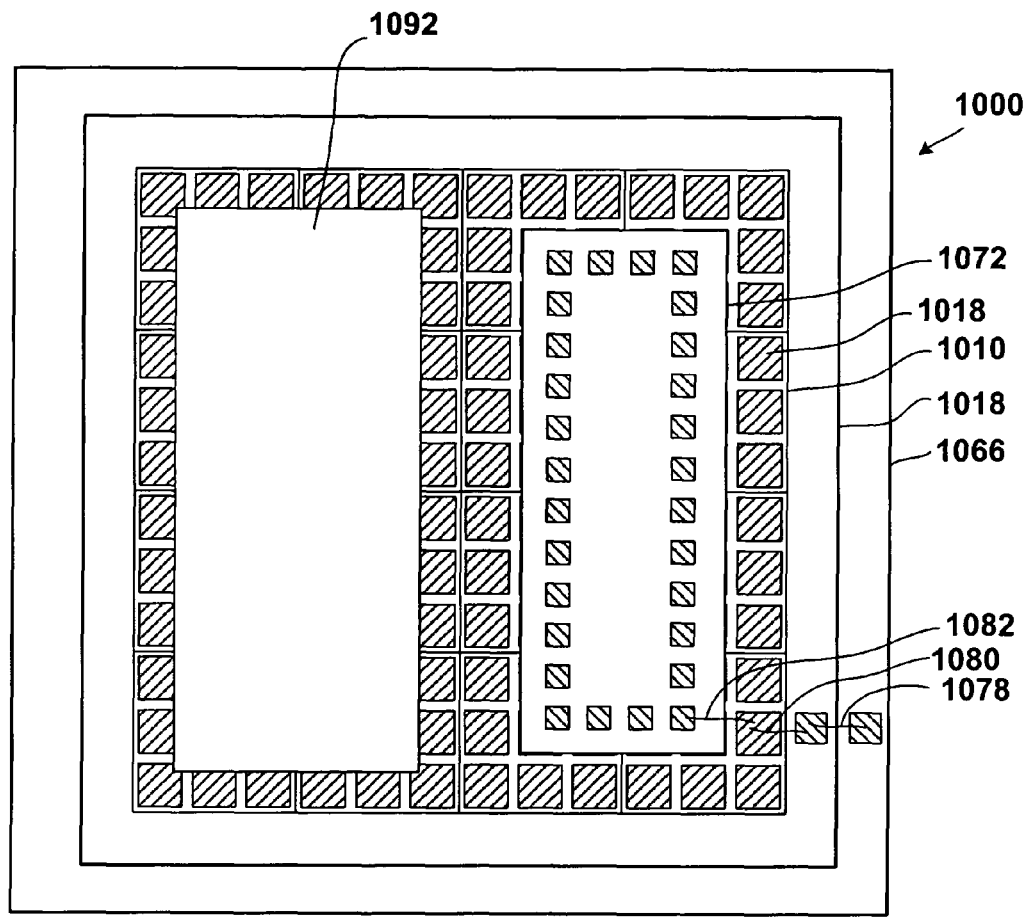
FIG. 10 is a top plan of chip package with an MSS, three dice, and a mounting substrate according to an embodiment.

FIG. 10 is a top plan of chip package 1000 with an MSS 1010, three dice 1060, 1072, and 1092, and a mounting substrate 1066 according to an embodiment. In an embodiment, the first die 1060 is a processor, the second die 1072 is a wire-bond memory chip, and the third die 1092 is a DSP. The chip package 1000 includes sixteen three-by-three MSS bond-pad microstrip spacer modules that make up the MSS 1010. For illustrative purposes, the chip package 1000 incorporates wire-bond and flip-chip connectivity to the MSS 1010. A nominal first die bond wire 1080 couples the MSS 1010 to the first die 1060. A nominal second die bond wire 1082 couples the MSS 1010 to the second die 1060. A plurality of third die electric bumps, one of which is designated with the reference numeral 1094 (FIG. 11), couples the MSS 1010 to the third die 1092. A mounting substrate 1066 is depicted as supporting the first die 1060. In an embodiment, the mounting substrate 1066 communicates electrically to the external world with a plurality of electrical bumps, one of which is designated with the reference numeral 1070.

In a method embodiment, the first die 1060 is a processor chip from Intel Corporation of Santa Clara, Calif. that operates at a first clock speed, the second die 1072 is a flash memory chip that operates at a second clock speed, and the third die 1092 is a DSP chip that operates at a third clock speed. In this embodiment, each of the respective first 1060, second 1072, and third 1092 dice are grounded into the MSS 1010, whether it is clock circuits, data circuits, address circuits, core power circuits, etc., to separate and distinct conductive planes in the MSS 1010. In an embodiment, a fraction of the circuits in all three dice are thusly grounded. In an embodiment, less than all three dice are thusly grounded. In an embodiment, less than all three dice include a fraction of their various circuits that are thusly grounded.

Figure 11:
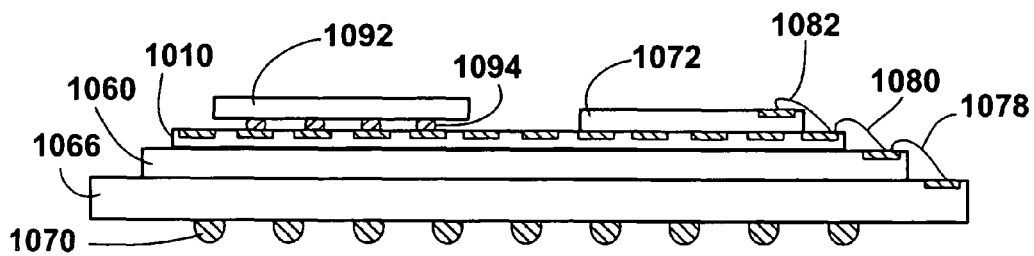
FIG. 11 is a cross-section elevation of the chip package depicted in FIG. 10 according to an embodiment.

FIG. 11 is a cross-section elevation of the chip package depicted in FIG. 10 according to an embodiment. In FIG. 11, the electrical bumps 1094 are revealed, as well as the plurality of electrical bumps 1070 below and on the mounting substrate 1066.

Figure 12:
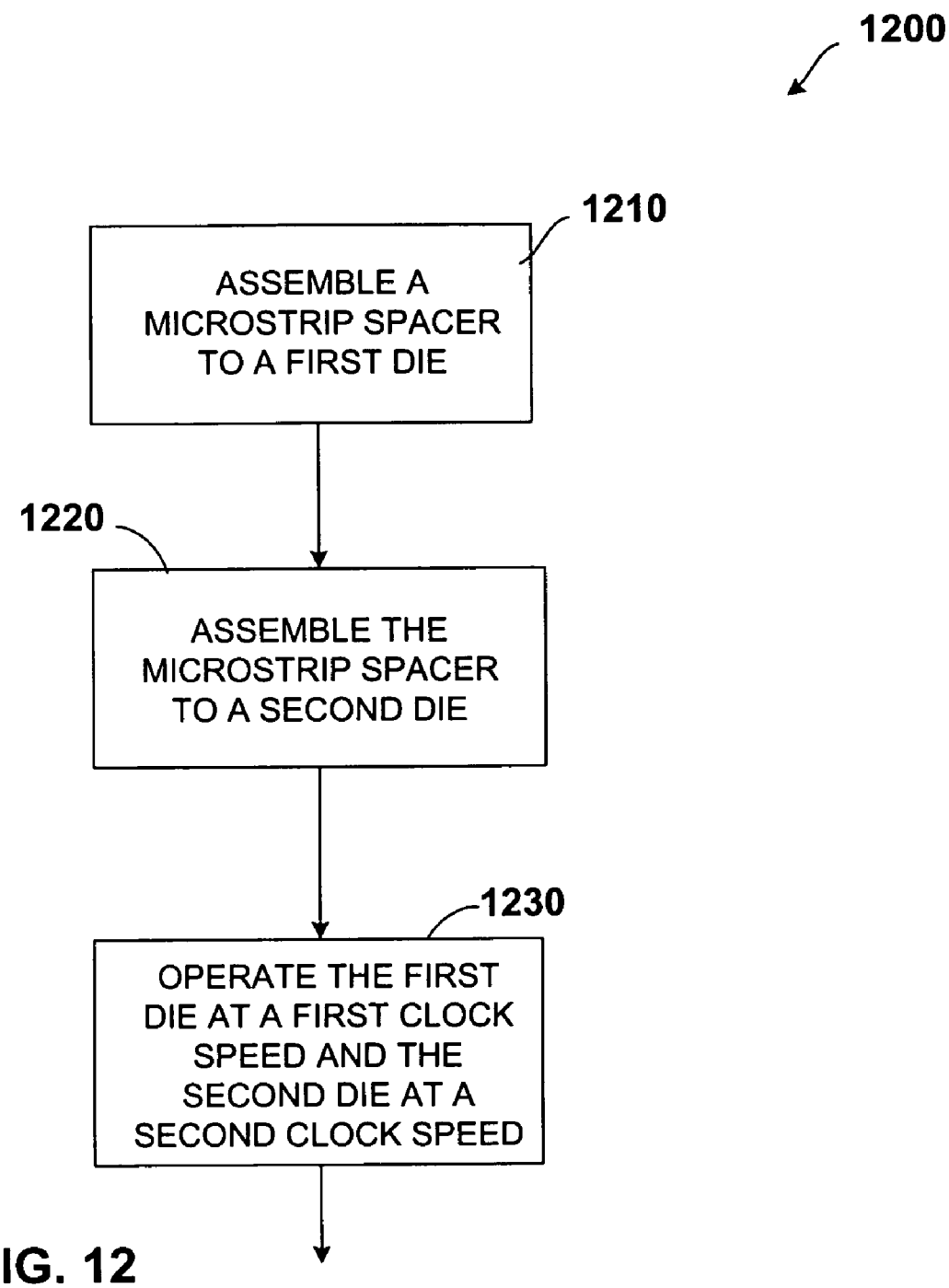
FIG. 12 is a flow chart that describes method flow embodiments.

FIG. 12 is a flow chart that describes method flow embodiments.

At 1210, the method includes assembling an MSS to a first die.

At 1220, the method includes assembling the MSS to a subsequent die. In an embodiment, the method commences at 1210 and terminates at 1220.

At 1230, the method includes operating the first die at a first clock speed and operating the subsequent die at a subsequent clock speed. In an embodiment, the method commences at 1230 and terminates at 1230.

Figure 13:
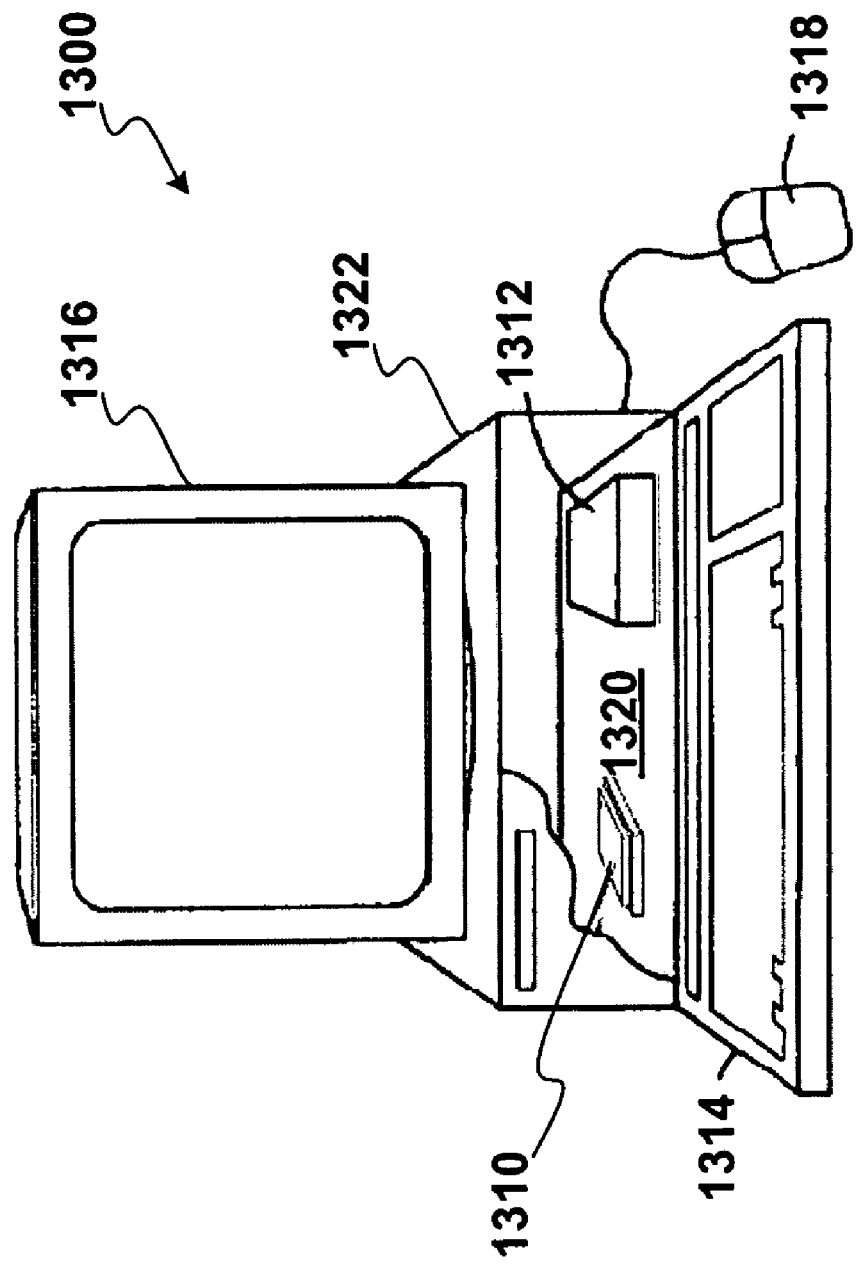
FIG. 13 is a cut-away elevation that depicts a computing system according to an embodiment.

FIG. 13 is a cut-away elevation that depicts a computing system 1300 according to an embodiment. One or more of the foregoing embodiments of the RF passive-device layer may be utilized in a computing system, such as a computing system 1300 of FIG. 13. Hereinafter any RF passive-device layer embodiment alone or in combination with any other embodiment is referred to as an embodiment(s) configuration.

The computing system 1300 includes at least one processor (not pictured), which is enclosed in an IC chip package 1310, a data storage system 1312, at least one input device such as a keyboard 1314, and at least one output device such as a monitor 1316, for example. The computing system 1300 includes a processor that processes data signals, and may include, for example, a microprocessor, available from Intel Corporation. In addition to the keyboard 1314, the computing system 1300 can include another user input device such as a mouse 1318, for example. The computing system 1300 can include a structure, after processing as depicted in FIGS. 1, 3, 4, and 5 of a given MSS embodiment. In an embodiment, the computing system 1300 includes a housing 1322 such as the box for a desktop computer.

For purposes of this disclosure, a computing system 1300 embodying components in accordance with the claimed subject matter may include any system that utilizes a microelectronic device system, which may include, for example, at least one of the MSS embodiments that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 1312.

In an embodiment, the computing system 1300 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP is part of a chipset that may include a stand-alone processor and the DSP as separate parts of the chipset on the board 1320. In this embodiment, an embodiment(s) configuration is coupled to the DSP, and a separate embodiment(s) configuration may be present that is coupled to the processor in the IC chip package 1310. Additionally in an embodiment, an embodiment(s) configuration is coupled to a DSP that is mounted on the same board 1320 as the IC chip package 1310. It can now be appreciated that the embodiment(s) configuration can be combined as set forth with respect to the computing system 1300, in combination with an embodiment(s) configuration as set forth by the various embodiments of the MSS within this disclosure and their equivalents.

It can now be appreciated that embodiments set forth in this disclosure can be applied to devices and apparatuses other than a traditional computer. For example, a die can be packaged with an embodiment(s) configuration, and placed in a portable device such as a wireless communicator or a handheld device such as a personal data assistant and the like. In this embodiment, the system housing can be a shell for a wireless telephone or the like. Another example is a die that can be packaged with an embodiment(s) configuration and placed in a vehicle such as an automobile, a locomotive, a watercraft, an aircraft, or a spacecraft.

Figure 14:
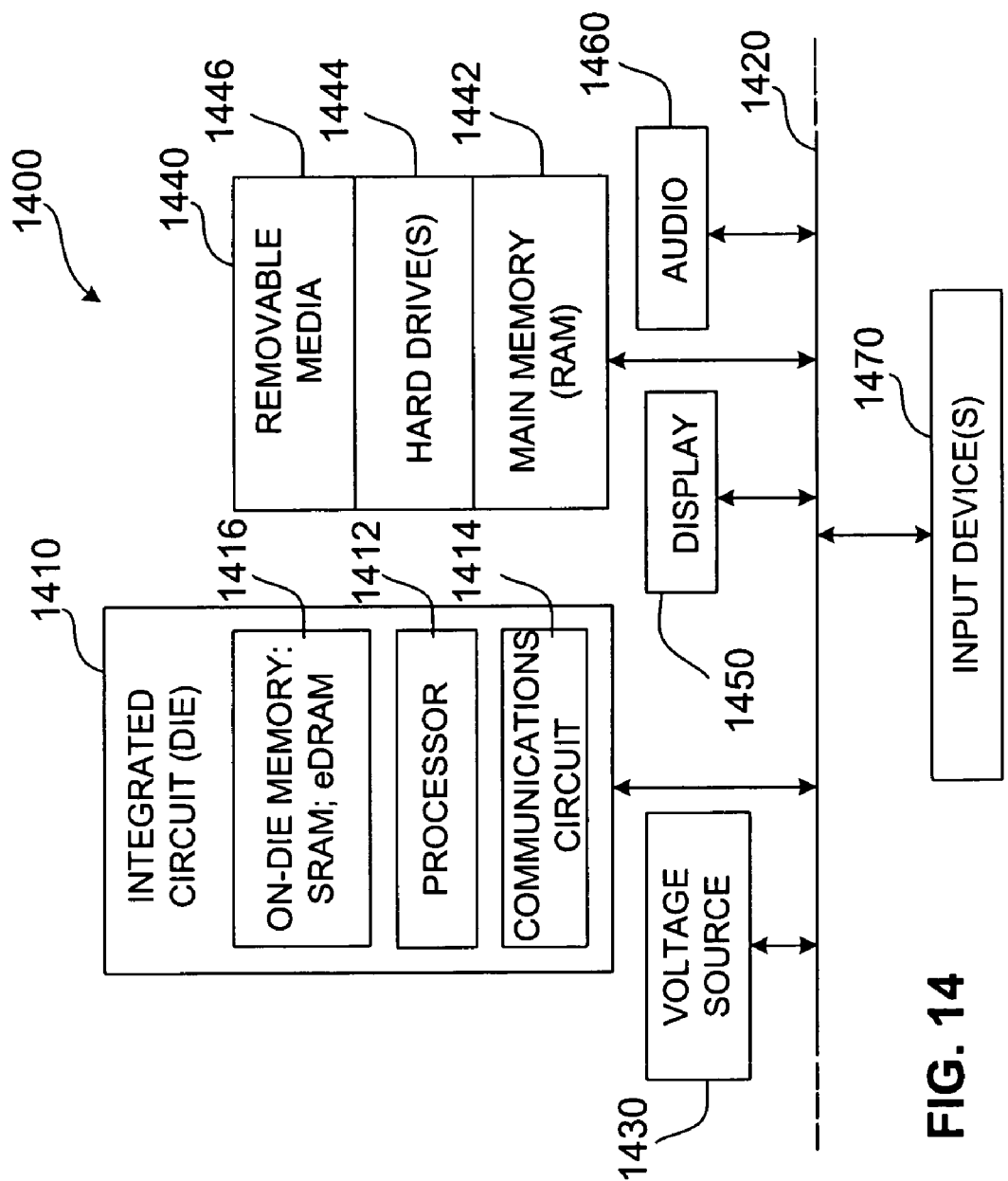
FIG. 14 is a schematic of a computing system according to an embodiment.

FIG. 14 is a schematic of an electronic system 1400 according to an embodiment. The electronic system 1400 as depicted can embody the computing system 1300 depicted in FIG. 13, but the electronic system is depicted more generically. The electronic system 1400 incorporates at least one electronic assembly 1410, such as an IC die illustrated in FIGS. 6, 8 and 10-11. In an embodiment, the electronic system 1400 is a computer system that includes a system bus 1420 to electrically couple the various components of the electronic system 1400. The system bus 1420 is a single bus or any combination of busses according to various embodiments. The electronic system 1400 includes a voltage source 1430 that provides power to the integrated circuit 1410. In some embodiments, the voltage source 1430 supplies current to the integrated circuit 1410 through the system bus 1420.

The integrated circuit 1410 is electrically coupled to the system bus 1420 and includes any circuit, or combination of circuits according to an embodiment. In an embodiment, the integrated circuit 1410 includes a processor 1412 that can be of any type. As used herein, the processor 1412 means any type of circuit such as, but not limited to, a microprocessor, a microcontroller, a graphics processor, a digital signal processor, or another processor. Other types of circuits that can be included in the integrated circuit 1410 are a custom circuit or an ASIC, such as a communications circuit 1414 for use in wireless devices such as cellular telephones, pagers, portable computers, two-way radios, and similar electronic systems. In an embodiment, the processor 1410 includes on-die memory 1416 such as SRAM. In an embodiment, the processor 1410 includes on-die memory 1416 such as eDRAM.

In an embodiment, the electronic system 1400 also includes an external memory 1440 that in turn may include one or more memory elements suitable to the particular application, such as a main memory 1442 in the form of RAM, one or more hard drives 1444, and/or one or more drives that handle removable media 1446, such as diskettes, compact disks (CDs), digital video disks (DVDs), flash memory keys, and other removable media known in the art.

In an embodiment, the electronic system 1400 also includes a display device 1450, an audio output 1460. In an embodiment, the electronic system 1400 includes a controller 1470, such as a keyboard, mouse, trackball, game controller, microphone, voice-recognition device, or any other device that inputs information into the electronic system 1400.

As shown herein, integrated circuit 1410 can be implemented in a number of different embodiments, including an electronic package, an electronic system, a computer system, one or more methods of fabricating an integrated circuit, and one or more methods of fabricating an electronic assembly that includes the integrated circuit and the MSS embodiments as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus comprising:
a first die including a first die active surface and a first die backside surface;
a microstrip spacer (MSS) including a plurality of spaced-apart conductive planes disposed therein, wherein the MSS includes a first side and a second side that are parallel-planar to the plurality of spaced-apart conductive planes, and wherein the MSS first side is disposed upon one of the first die active surface and the first die backside surface;
a second die including a second die active surface and a second die backside surface, wherein one of the second die active surface and the second die backside surface is disposed against the MSS second side, and wherein one of the first die and the second die principally includes dynamic random-access memory, and wherein the other of the first die and the second die principally includes logic circuitry; and
a third die disposed on the MSS second side, wherein the MSS contains an inductor.

2. The apparatus of claim 1, wherein at least one of the first die and the second die is electrically coupled to the MSS.

3. The apparatus of claim 1, further including a mounting substrate and wherein the first die is disposed on the mounting substrate by a configuration selected from wire-bond and flip-chip.

4. An apparatus comprising:
a first die including a first die active surface and a first die backside surface;
a microstrip spacer (MSS) including a plurality of spaced-apart conductive planes disposed therein, wherein the MSS includes a first side and a second side that are parallel-planar to the plurality of spaced-apart conductive planes, and wherein the MSS first side is disposed upon one of the first die active surface and the first die backside surface;
a second die including a second die active surface and a second die backside surface, wherein one of the second die active surface and the second die backside surface is disposed against the MSS second side, and wherein one of the first die and the second die principally includes dynamic random-access memory, and wherein the other of the first die and the second die principally includes logic circuitry; and
a third die disposed on the MSS second side, wherein the MSS contains a resistor, selected from a metallic resistor, a fuse, and a combination thereof.

5. A system comprising:
a first die including a first die active surface and a first die backside surface;
a microstrip spacer (MSS) including a plurality of spaced-apart conductive planes disposed therein, wherein the MSS includes a first side and a second side that are parallel-planar to the plurality of spaced-apart conductive planes, and wherein the MSS first side is disposed upon one of the first die active surface and the first die backside surface;
a second die including a second die active surface and a second die backside surface, wherein one of the second die active surface and the second die backside surface is disposed against the MSS second side, a first die including a first die active surface and a first die backside surface, and wherein one of the first die and the second die principally includes dynamic random-access memory, and wherein the other of the first die and the second die principally includes logic circuitry;
a system housing in which the first die, the second die and the MSS are disposed; and a third die disposed on the MSS second side, wherein the MSS contains an inductor.

6. The system of claim 5, wherein the first die is disposed upon a mounting substrate.

7. The system of claim 5, wherein the system is disposed in one of a computer, a wireless communicator, a hand-held device, an automobile, a locomotive, an aircraft, a watercraft, and a spacecraft.

8. A system comprising:
a first die including a first die active surface and a first die backside surface;
a microstrip spacer (MSS) including a plurality of spaced-apart conductive planes disposed therein, wherein the MSS includes a first side and a second side that are parallel-planar to the plurality of spaced-apart conductive planes, and wherein the MSS first side is disposed upon one of the first die active surface and the first die backside surface;
a second die including a second die active surface and a second die backside surface, wherein one of the second die active surface and the second die backside surface is disposed against the MSS second side, a first die including a first die active surface and a first die backside surface, and wherein one of the first die and the second die principally includes dynamic random-access memory, and wherein the other of the first die and the second die principally includes logic circuitry;
a system housing in which the first die, the second die and the MSS are disposed; and
a third die disposed on the MSS second side, wherein the MSS contains a resistor, selected from a metallic resistor, a fuse, and a combination thereof.

9. A system comprising:
a first die including a first die active surface and a first die backside surface;
a microstrip spacer (MSS) including a plurality of spaced-apart conductive planes disposed therein, wherein the MSS includes a first side and a second side that are parallel-planar to the plurality of spaced-apart conductive planes, and wherein the MSS first side is disposed upon one of the first die active surface and the first die backside surface;
a second die including a second die active surface and a second die backside surface, wherein one of the second die active surface and the second die backside surface is disposed against the MSS second side, a first die including a first die active surface and a first die backside surface, and wherein one of the first die and the second die principally includes dynamic random-access memory, and wherein the other of the first die and the second die principally includes logic circuitry;
a system housing in which the first die, the second die and the MSS are disposed; and
a third die disposed on the MSS second side, wherein the MSS contains at least two of an inductor, a capacitor, and a resistor.

10. The system of claim 9, further including a mounting substrate and wherein the first die is disposed on the mounting substrate by a configuration selected from wire-bond and flip-chip.

* * * * *